(12) United States Patent
An (10) Patent No.: US 9,579,741 B2
(45) Date of Patent: Feb. 28, 2017

(54) APPARATUS FOR ADSORBING SOLDER BALL AND METHOD OF ATTACHING SOLDER BALL USING THE SAME

(71) Applicant: SAMSUNG ELECTRONICS CO., LTD., Suwon-si (KR)

(72) Inventor: Eun-Sun An, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/674,019

(22) Filed: Mar. 31, 2015

(65) Prior Publication Data

US 2016/0016247 A1 Jan. 21, 2016

(30) Foreign Application Priority Data

Jul. 21, 2014 (KR) .................. 10-2014-0091968

(51) Int. Cl.
*B23K 1/00* (2006.01)
*B23K 3/06* (2006.01)
*H01L 23/00* (2006.01)
*H05K 3/34* (2006.01)

(52) U.S. Cl.
CPC .......... *B23K 3/0623* (2013.01); *B23K 1/0016* (2013.01); *H01L 24/742* (2013.01); *H01L 24/11* (2013.01); *H01L 24/13* (2013.01); *H01L 2224/03828* (2013.01); *H01L 2224/11334* (2013.01); *H01L 2224/11849* (2013.01); *H01L 2224/131* (2013.01); *H05K 3/3436* (2013.01); *H05K 3/3478* (2013.01); *H05K 2203/041* (2013.01); *H05K 2203/082* (2013.01)

(58) Field of Classification Search
None
See application file for complete search history.

(56) References Cited

U.S. PATENT DOCUMENTS

| 5,540,377 A | * | 7/1996 | Ito ...................... B23K 3/0607 228/41 |
| 5,626,277 A | * | 5/1997 | Kawada ............... B23K 3/0623 228/246 |
| 6,119,925 A | * | 9/2000 | Lin ...................... B23K 3/0638 228/180.22 |

(Continued)

FOREIGN PATENT DOCUMENTS

| JP | 2004-253770 A | 9/2004 |
| JP | 2009-010113 A | 1/2009 |

(Continued)

*Primary Examiner* — Kiley Stoner
(74) *Attorney, Agent, or Firm* — Sughrue Mion, PLLC (57) ABSTRACT

Provided are an apparatus of adsorbing solder balls and a method of attaching the solder balls using the same. The solder ball adsorbing apparatus includes a body, a plurality of eject pins disposed in the body and configured to move in downward and upward directions with respect to a substrate on which the solder balls are to be loaded, and a solder ball holder disposed in the body and configured to hold the solder balls at the eject pins and release the solder balls therefrom. The eject pins include a first eject pin disposed at a center of the body in parallel with a vertical surface that is perpendicular to a bottom surface of the body, a second eject pin disposed at an edge of the body at a first angle with respect to the vertical surface, and a third eject pin disposed between the first and second eject pins.

17 Claims, 6 Drawing Sheets

(56) References Cited

U.S. PATENT DOCUMENTS

| | | | |
|---|---|---|---|
| 6,230,963 B1* | 5/2001 | Hertz | B23K 3/0623 228/246 |
| 6,255,132 B1 | 7/2001 | Fujimura | |
| 6,460,755 B1* | 10/2002 | Inoue | B23K 3/0623 228/180.22 |
| 6,533,159 B1* | 3/2003 | Cobbley | B23K 3/0623 228/20.1 |
| 6,604,673 B1* | 8/2003 | Bourrieres | B23K 3/0607 228/246 |
| 7,506,792 B1* | 3/2009 | Manfroy | B23K 1/0016 228/246 |
| 8,074,867 B2 | 12/2011 | Niizuma | |
| 2001/0008249 A1* | 7/2001 | Hertz | B23K 3/0623 228/246 |
| 2002/0053591 A1* | 5/2002 | Razon | B23K 3/0623 228/258 |
| 2002/0158108 A1* | 10/2002 | Cheng | B23K 3/0623 228/110.1 |
| 2002/0179696 A1* | 12/2002 | Pattanaik | B23K 3/0623 228/246 |
| 2004/0094601 A1* | 5/2004 | Hazeyama | H01L 21/4853 228/41 |
| 2005/0045701 A1* | 3/2005 | Shindo | B23K 3/0623 228/246 |
| 2009/0120996 A1* | 5/2009 | Kitamura | B23K 1/0016 228/41 |
| 2010/0127048 A1 | 5/2010 | Niizuma | |
| 2014/0339291 A1* | 11/2014 | Chen | B23K 3/0623 228/248.1 |
| 2015/0122873 A1* | 5/2015 | Lee | B23K 3/0623 228/41 |
| 2015/0230346 A1* | 8/2015 | Tanno | B23K 1/0016 228/248.1 |

FOREIGN PATENT DOCUMENTS

| | | |
|---|---|---|
| KR | 10-0430580 B1 | 5/2004 |
| KR | 10-2004-0063020 A | 7/2004 |
| KR | 10-0549301 B1 | 2/2006 |
| KR | 10-0660032 B1 | 12/2006 |
| KR | 10-1293452 B1 | 8/2013 |

* cited by examiner

APPARATUS FOR ADSORBING SOLDER BALL AND METHOD OF ATTACHING SOLDER BALL USING THE SAME

CROSS-REFERENCE TO THE RELATED APPLICATIONS

This application claims priority from Korean Patent Application No. 10-2014-0091968, filed on Jul. 21, 2014, the entire disclosure of which in incorporated herein in its entirety by reference.

BACKGROUND

Apparatuses and methods consistent with exemplary embodiments relate to manufacturing a semiconductor package, and more particularly, to adsorbing a solder ball in manufacturing the semiconductor package.

Semiconductor devices are being widely used in various electronic industrial fields due to their characteristics such as miniaturization, multifunction, and/or low manufacturing costs. Also, demands for high integration of semiconductor devices are increased. These demands are no exception to the semiconductor packages. Recently, a distance between pads having the same pitch is expanded according to a molding material and a package structure to cause misalignment of solder balls, resulting in a limitation in electrical connection.

SUMMARY

A plurality of exemplary embodiments provide a solder ball adsorbing apparatus for manufacturing an electrically reliable semiconductor package.

The exemplary embodiments also provide a method of attaching solder balls using a solder ball adsorbing apparatus.

According to an exemplary embodiment, there is provided an apparatus of adsorbing solder balls. The apparatus may include a body, a plurality of eject pins disposed in the body and configured to move in downward and upward directions with respect to a substrate on which the solder balls are to be loaded, and a solder ball holder disposed in the body and configured to hold the solder balls at the eject pins and release the solder balls therefrom. The eject pins include a first eject pin disposed at a center of the body in parallel with a vertical surface that is perpendicular to a bottom surface of the body, and a second eject pin disposed at an edge of the body at a first angle with respect to the vertical surface.

The eject pins may further include the third eject pin disposed between the first and second eject pins at a second angle with respect to the vertical surface.

The second angle may be substantially the same as the first angle.

The second angle may be less than the first angle.

The eject pins may be movable through the holes, respectively, disposed at the solder ball holder, and each of the holes may have a structure corresponding to a structure of each of the eject pins.

The solder ball adsorbing apparatus may further include a vacuum supplier connected to the solder ball holder to provide vacuum for respectively holding the solder balls on the eject pins.

The solder ball adsorbing apparatus may further include a plate to which the eject pins are connected, and an eject pin driver connected to the plate configured to move the eject pins in the downward and upward directions.

The eject pins may be disposed in the body symmetrically with respect to the first eject pin.

The solder ball adsorbing apparatus may further include a driver configured to move the solder ball holder in a downward direction toward the substrate to release the solder balls from the eject pins to be loaded on a plurality of pads formed on the substrate, respectively. Here, at a time of releasing the solder balls from the eject pins, the driver may maintain a vertical distance between a bottom end of the solder ball holder and each of the plurality of pads by using a distance x between two adjacent pads among the plurality of pads and an inclination θ of the second eject pin.

The body may further include paths through which the plurality of eject pins respectively move, the paths communicating with the holes.

Each of the holes may include a connection hole communicating with each of the paths, and a holding hole communicating with the connection hole to hold and release each of the solder balls.

The holding hole may have a width greater than width of the connection hole, and the holding hole may have a width substantially equal to or greater than width of the solder ball.

According to another exemplary embodiment, there is provided an apparatus for adsorbing solder balls which may include a solder ball holder including a plurality of holes in which a plurality of eject pins are disposed therein to hold and release the solder balls therefrom, respectively. The plurality of holes include a first hole disposed at a center of the solder ball holder and extended to be parallel with a vertical surface that is perpendicular to a substrate on which the solder balls released from the eject pins are to be loaded, and a second hole disposed at an edge of the solder ball holder and extended at a first angle with respect to the vertical surface. Here, the plurality of holes may further include a third hole disposed between the first and second holes and extended at a second angle with respect to the vertical surface. The second angle may be substantially the same as or less than the first angle.

According to still another exemplary embodiment, there is provided an apparatus for adsorbing solder balls which may include a body, a plurality of eject pins disposed in a plurality of paths of the body and configured to hold and release the solder balls, each of the plurality of eject pins being configured to move through a corresponding path among the plurality of paths. The apparatus may also include a solder ball holder which is disposed in the body and includes a plurality of first holes and a plurality of second holes. The apparatus may further include a vacuum supplier connected to the solder ball holder and configured to provide vacuum for holding the solder balls on the eject pins. The plurality of first holes may be configured to temporarily accommodate the solder balls, and the plurality of second holes may be configured to connect the plurality of holes to the plurality of paths.

The body may include a connection line connected to the vacuum supplier for supplying vacuum to the solder ball holder.

The apparatus may further include a driver configured to move the body and the plurality of eject pins.

BRIEF DESCRIPTION OF THE DRAWINGS

The accompanying drawings are included to provide a further understanding of the inventive concept, and are incorporated in and constitute a part of this specification.

The drawings illustrate the exemplary embodiments of the inventive concept and, together with the description, serve to explain principles of the inventive concept. In the drawings.

DETAILED DESCRIPTION OF THE EXEMPLARY EMBODIMENTS

The objects, other objects, features, and advantages of the inventive concept will become apparent with the detailed descriptions of the exemplary embodiment and the illustrations of related drawings as follows. The inventive concept may, however, be embodied in many different forms and should not be construed as being limited to the embodiments set forth herein. Rather, these embodiments are provided such that this disclosure will be thorough and complete, and will fully convey the inventive concept to those skilled in the art.

In the specification, it will be understood that when a component is referred to as being 'on' another component, it can be directly on the other component, or an intervening component may also be present. Also, in the figures, the dimensions of components are exaggerated for clarity of illustration.

The exemplary embodiments will be described with sectional views and/or plain views as ideal exemplary views of the inventive concept. Also, in the drawings, the dimensions of layers and regions are exaggerated for clarity of illustration. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. For example, an etched region having a right angle illustrated in the drawings may have a round shape or a shape having a predetermined curvature. Areas exemplified in the drawings have general properties, and are used to illustrate a specific shape of a semiconductor package region. Thus, this should not be construed as limited to the scope of the inventive concept. It will be understood that although the terms first and second are used herein to describe various elements, these elements should not be limited by these terms. These terms are only used to distinguish one element from another element. An embodiment described and exemplified herein includes a complementary embodiment thereof.

In the following description, the technical terms are used only for explaining a specific exemplary embodiment while not limiting the inventive concept. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

Hereinafter, the exemplary embodiments will be described in detail with reference to the accompanying drawings.

Solder balls may be used in a semiconductor package to electrically connect two devices (for example, a chip and substrate or a package and package) to each other. The solder balls may be picked up and attached on one of the two devices by using a solder ball adsorbing apparatus. Hereinafter, the solder ball adsorbing apparatus will be described in more detail. Especially, it is exemplarily described that solder balls are respectively attached to a plurality of pads formed on a substrate, but the embodiment is not limited thereto.

Hereinafter, a solder ball adsorbing apparatus according to an exemplary embodiment will be described in detail.

Figure 1A:
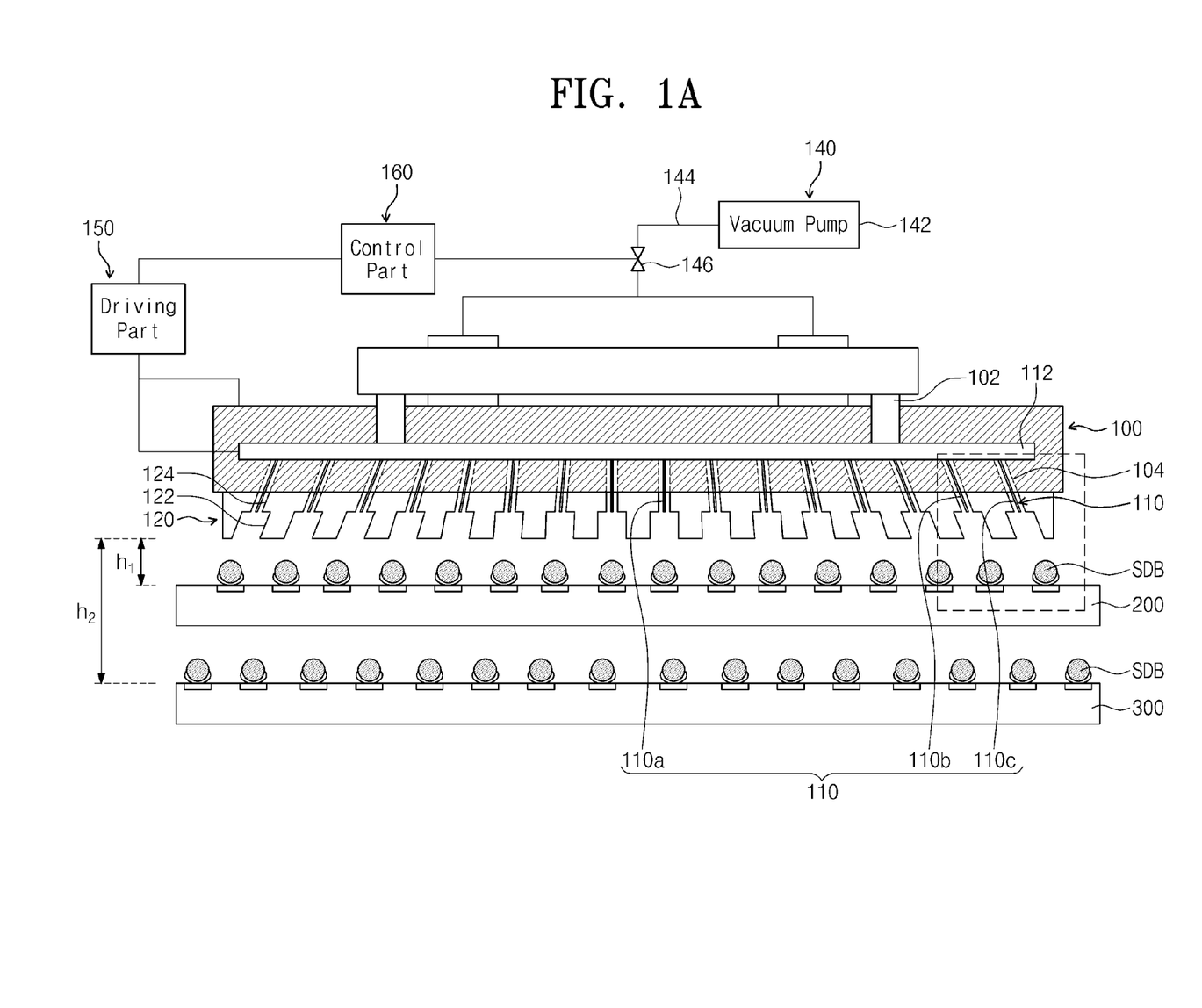
FIG. 1A is a cross-sectional view of a solder ball adsorbing apparatus according to an exemplary embodiment.
Figure 1B:
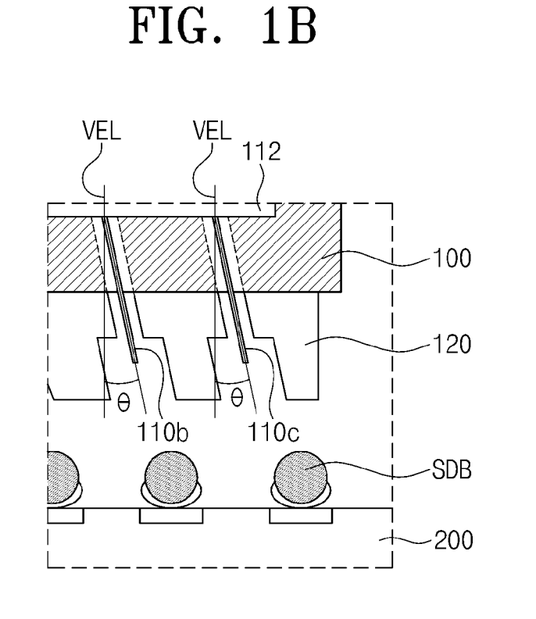
FIG. 1B is an enlarged view of eject pins, according to an exemplary embodiment.
Figure 1C:
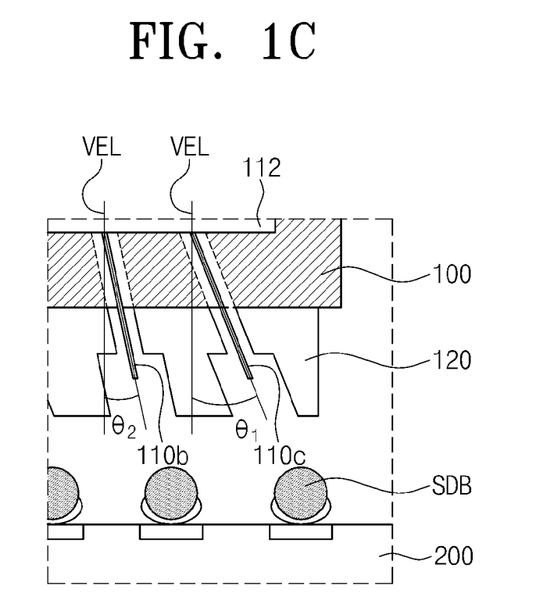
FIG. 1C is an enlarged view of eject pins, according to an exemplary embodiment.

FIG. 1A is a cross-sectional view of a solder ball adsorbing apparatus according to an exemplary embodiment, FIG. 1B is an enlarged view of eject pins according to an exemplary embodiment, and FIG. 1C is an enlarged view of eject pins according to another exemplary embodiment.

Referring to FIG. 1A, the solder ball adsorbing apparatus may include a body 100, a solder ball holder 120, and a vacuum supplier 140.

The body 100 may include a connection line 102 connected to the vacuum supplier 140 for supplying vacuum to the solder ball holder 120, a plurality of paths 104 communicating with the connection line 102, and eject pins 110 respectively disposed in the paths 104. The eject pins 110 may be disposed in the body 100 to pass through centers of the paths 104, respectively. The eject pins 110 may move in downward and upward directions with respect to a substrate on which a plurality of pads are formed to which solder balls are to be loaded.

The eject pins 110 may be connected to one plate 112. The eject pins 110 may be spaced apart from one another in a line on the one plate 112. According to an exemplary embodiment, the eject pins 110 may be disposed at a predetermined inclination at a bottom edge of the body 100.

For easiness of description, an eject pin disposed in a central portion of the body 100 among the eject pins 110 is called a first eject pin 110a, an eject pin disposed on the edge of the body 100 is called a second eject pin 110c, and an eject pin disposed between the first and second eject pins 110a and 110c is called a third eject pin 110b. Each of the first to third eject pins 110a, 110b, and 110c may be one pin or a plurality of groups of pins. For example, the second eject pin 110c may be two second eject pins 110c that are disposed at two side edges of the body 100, respectively, in a mirrored relationship (mirror image) with respect to the first eject pin 110a.

According to an exemplary embodiment of FIGS. 1A and 1B, the first eject pin 110a may be substantially parallel to a surface (hereinafter, referred to as a vertical surface VEL) perpendicular to a bottom surface of the body 100 or top surfaces of substrates 200 and 300 on which the solder balls SDB are being loaded. The second eject pin 110c may be inclined at a predetermined angle from the vertical surface VEL. In detail, the second eject pin 110c may extend to be inclined at an angle θ with respect to the vertical surface VEL to be directed toward the bottom edge of the body 100 from the plate 112. The third eject pin 110b may be inclined at the same angle θ as the second eject pin 110c. That is, the third eject pin 110b may be substantially parallel to the second eject pin 110c.

According to another exemplary embodiment of FIGS. 1A-1C, the first eject pin 110a may be substantially parallel to the vertical surface VEL. The second eject pin 110c may be inclined at a first angle $\theta_1$ from the vertical surface VEL, and the third eject pin 110b may be inclined at a second angle $\theta_2$ which is less than the first angle $\theta_1$.

As mentioned above, since the eject pins 110 are disposed within the paths 104, a channel of each of the paths 104, the holding holes 122 and the connection holes 124 may be inclined to correspond to the inclination of each of the eject pins 110. Exemplarily explaining with reference to FIGS. 1A-1C, the path 104 in which the first eject pin 110a is disposed may be parallel to the vertical surface VEL, and the paths 104 in which the second and the third eject pin 110c and 110b are disposed may be inclined at predetermined angles with respect to the vertical surface VEL.

The solder ball holder 120 may include holding holes 122 for respectively temporarily accommodating the solder balls SDB, and connection holes 124 for respectively connecting the holding holes 122 to the paths 104. The connection holes 124 may communicate with the holding holes 122, respectively. Each of the holding holes 122 may have a width that is substantially equal to or greater than a width of each of the solder balls SDB. Each of the connection holes 124 may have a width less than a width of the holding hole 122 and have substantially the same width as the path 104. Also, each of the path 104 and the connection hole 124 may have a width greater than a width of the eject pin 110.

The holding hole 122 may have a lower end that is opened to a bottom end of the solder ball holder 120.

The eject pin 110 may be disposed in the connection hole 124 to move down to the holding hole 122. The connection hole 124 may have an upper portion communicating with the path 104 and a lower portion communicating with the holding hole 122. The eject pin 110 may pass through a center of each of the path 104, the connection hole 124, and the holding hole 122 to move along a central axis of each of the path 104, the connection hole 124, and the holding hole 122. Accordingly, the central axis of each of the connection hole 124 and holding hole 122 may be inclined to correspond to the inclination of the eject pin 110.

The solder ball adsorbing apparatus may further include a driver 150 for moving the body 100 and the eject pins 110. The driver 150 may be connected to the body 100 to move the body 100, thereby adjusting vertical distances h1 and h2 with respect to the substrates 200 and 300 on which the solder balls SDB are loaded. The driver 150 may be connected to the plate 112 to move the eject pins 110 in a downward direction, thereby ejecting the solder balls SDB from the solder ball adsorbing apparatus. According to another exemplary embodiment, the driver 150 connected to the body 100 and the driver 150 connected to the plate 112 may be different from each other.

The vacuum supplier 140 may include a vacuum pump 142, a vacuum line 144 connecting the vacuum pump 142 to the body 100, and a vacuum valve 146 installed on the vacuum line 144. The vacuum line 144 may communicate with the connection line 102 of the body 100. As mentioned above, the connection line 102 may communicate with the paths 104, the connection holes 124, and the holding holes 122. Accordingly, when the vacuum pump 142 provides vacuum, the solder balls SDB may be adsorbed on the holding holes 122, respectively.

According to an exemplary embodiment, the solder ball adsorbing apparatus may further include a controller 160 connected to the vacuum supplier 140 and the driver 150. For example, the controller 160 may be connected to the vacuum valve 146 of the vacuum supplier 140 to control opening and closing of the vacuum valve 146. In addition, the controller 160 may be connected to the driver 150 to move the body 100, thereby adjusting the vertical distances h1 and h2 between the solder balls SDB, in a state of being adsorbed on the holding holes 122, and the substrates 200 and 300, and to move the eject pins 110 in a downward direction, thereby ejecting the solder balls SDB to desired positions.

A semiconductor package may be expanded according to a thickness of a mounted chip or kinds of molding materials. Especially, when a substrate on which the pads are formed is expanded, the solder balls attached on the pads have to move according to positions of the pads formed on the expanded substrate. The solder balls may be exactly disposed on the desired positions by using the solder ball adsorbing apparatus according to an exemplary embodiment. This will now be described in more detail.

FIGS. 2A through 2D are cross-sectional views illustrating a method of attaching a solder ball, according to an exemplary embodiment.

Figure 2A:
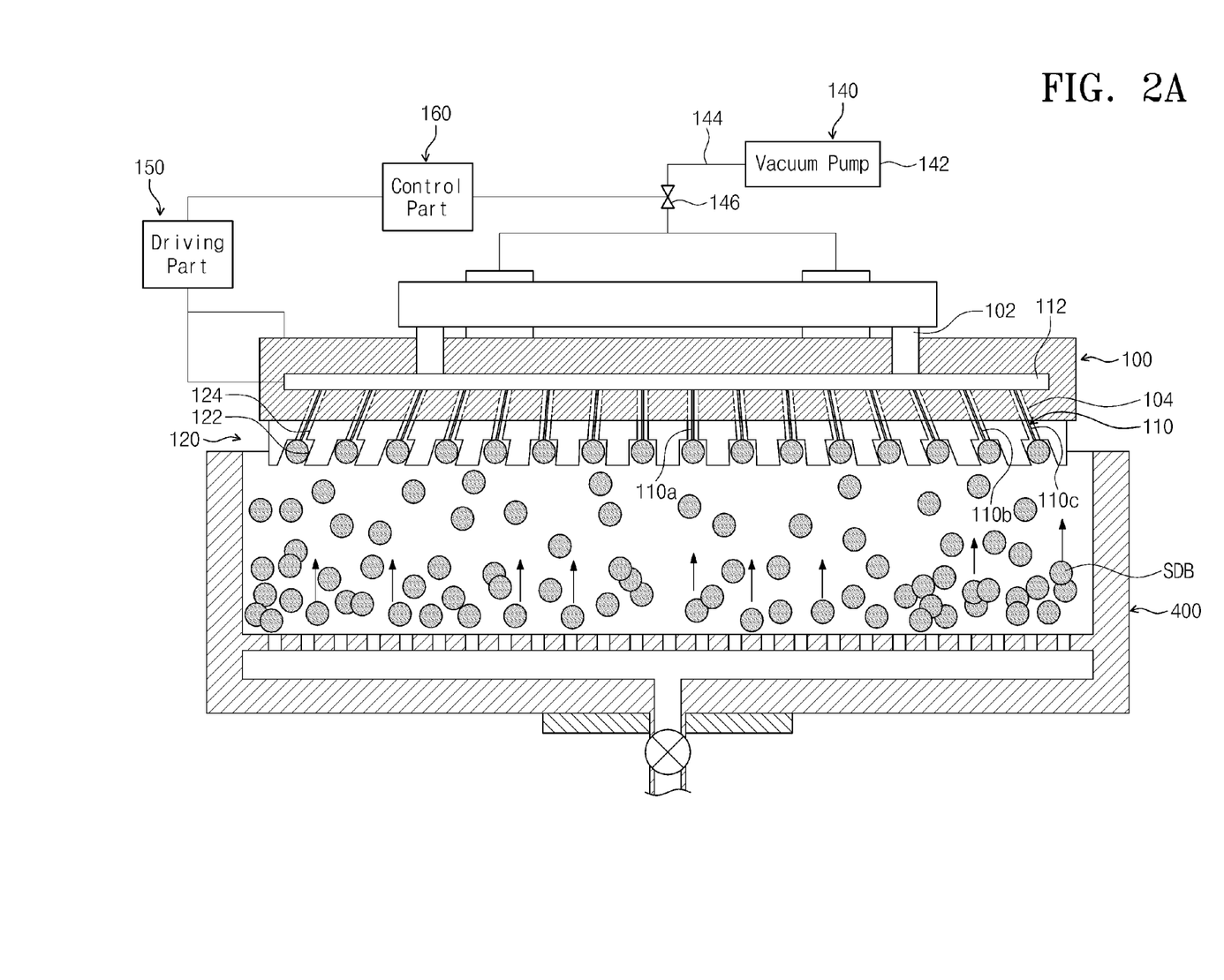
FIGS. 2A through 2D are cross-sectional views illustrating a method of attaching a solder ball, according to exemplary embodiments.

Referring to FIG. 2A, solder balls SDB may be adsorbed on a solder ball adsorbing apparatus from a storage 400 in which the solder balls SDB are stored.

In detail, a controller 160 of the solder ball adsorbing apparatus may open a vacuum valve 146 of a vacuum supplier 140 to allow the solder balls SDB to be respectively adsorbed on holding holes 122. Here, each of eject pins 110 may be disposed in each of paths 104 and connection holes 124 which communicate with each other.

Figure 2B:
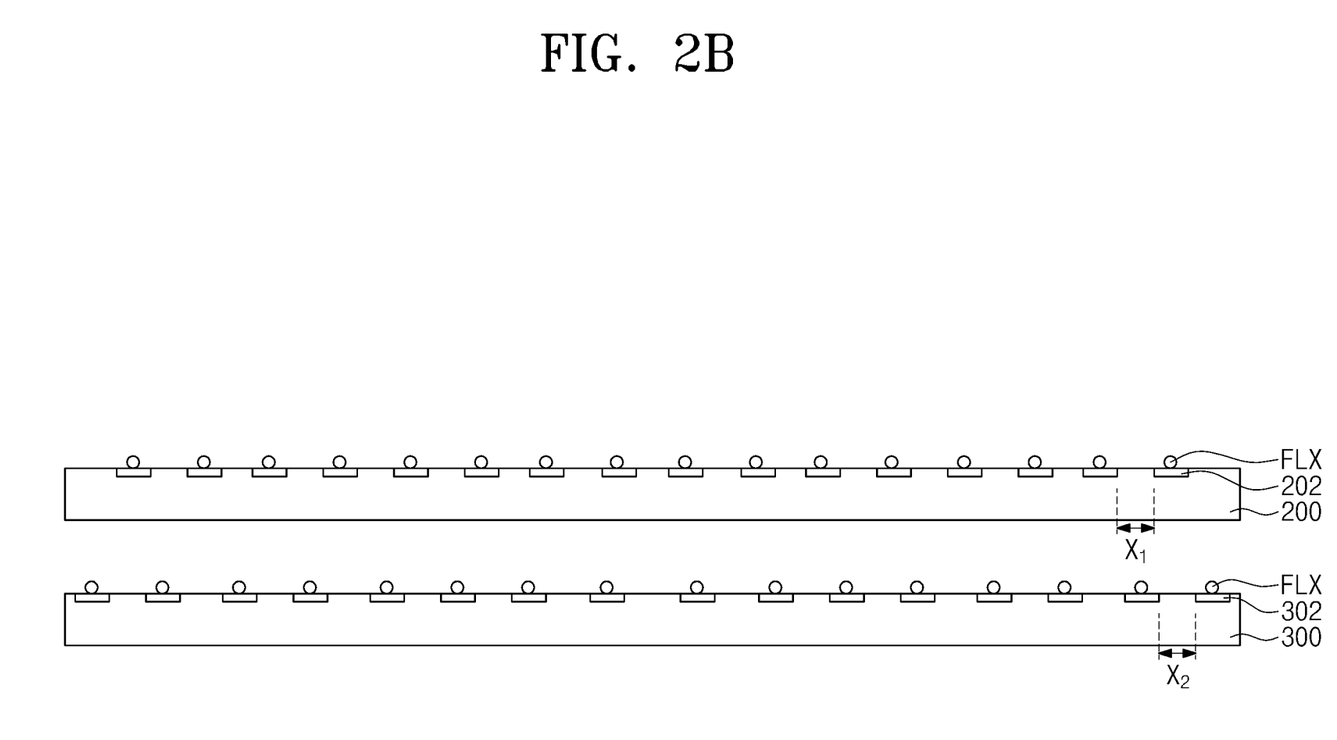

Referring to FIG. 2B, substrates 200 and 300 on which pads 202 and 302 are formed may be prepared. The two substrates 200 and 300 will be exemplarily described in this embodiment. First pads 202 are formed on the first substrate 200. Here, the two first pads 202 adjacent to each other may be spaced a first distance $x_1$ from each other. Second pads 302 are formed on the second substrate 300. Here, the two second pads 302 adjacent to each other may be spaced a second distance $x_2$ from each other. The second distance $x_2$ may be greater than the first distance $x_1$.

According to an exemplary embodiment, a flux FLX may be dotted on each of the first pads 202 and the second pads 302.

Figure 2C:
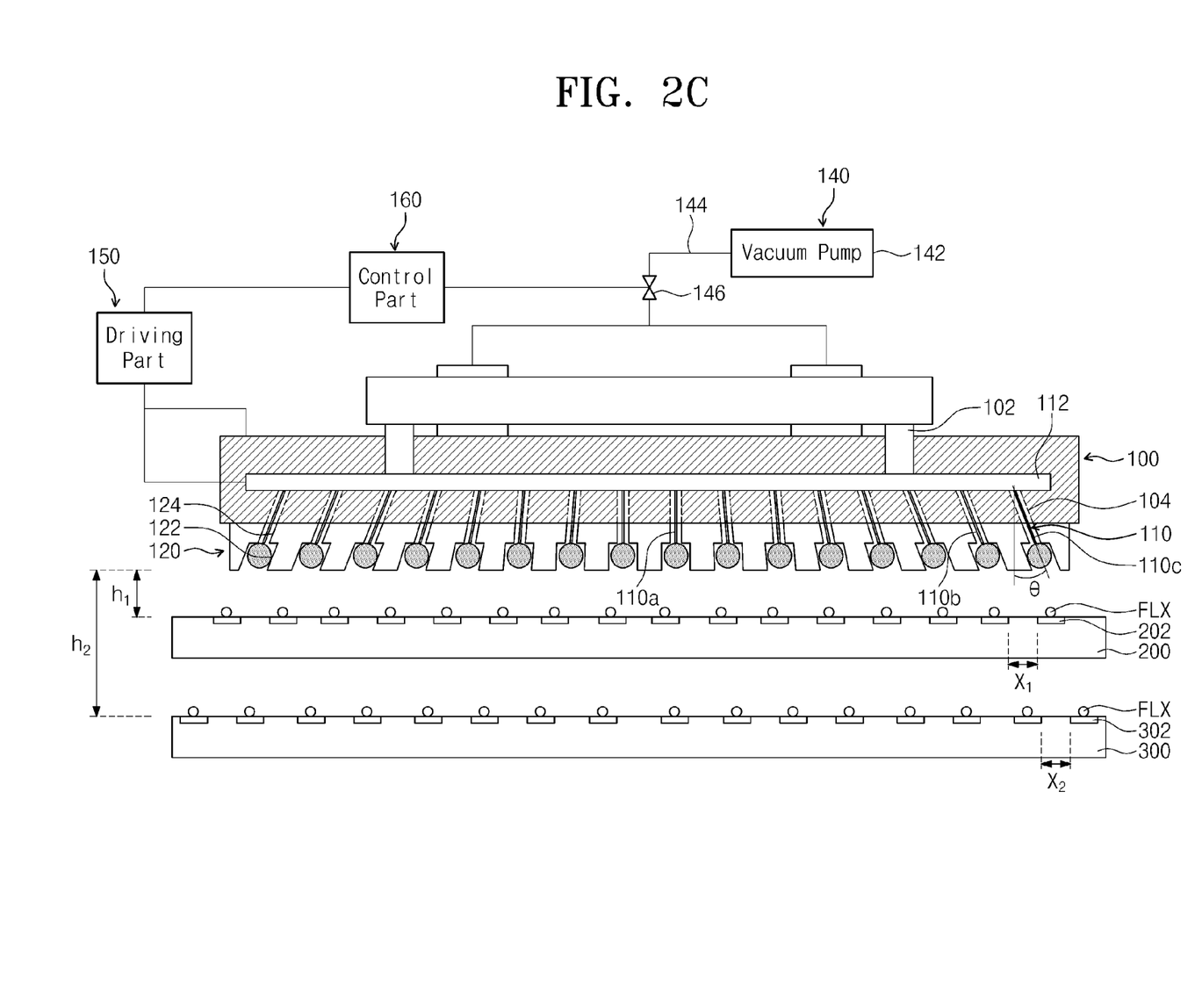

Referring to FIG. 2C, the solder balls SDB may be provided to the pads 202 and 302 that are spaced different distances from each other by using one solder ball adsorbing apparatus according to exemplary embodiments. The solder balls may be disposed at desired positions by adjusting distances $h_1$ and $h_2$ between the solder ball adsorbing apparatus, onto which the solder balls are adsorbed, and the substrates 200 and 300.

In more detail, when the first substrate 200 on which the first pads 202 are formed is exemplarily described, a vertical distance $h_1$ between a bottom end of the solder ball SDB, in a state of being adsorbed on the holding holes 122, and a top surface of the first pad 202 may be adjusted by using a driver 150 of the solder ball adsorbing apparatus. The vertical distance $h_1$ between the bottom end of the solder ball SDB, in a state of being adsorbed on the holding holes 122, and the top surface of the first pad 202 may be determined by using the first distance $x_1$ between the two first pads 202 adjacent to each other and an inclination θ of a second or third eject pin 110c or 110b of the solder ball adsorbing apparatus. Exemplarily, when the inclination θ of the third eject pin 110b is used, the vertical distance $h_1$ between the bottom end of the solder ball, in a state of being adsorbed on the holding holes 122, and the top surface of the first pad 202 may be expressed by the following Equation (1).

$$h_1 = x_1 \times \tan\theta \quad (1)$$

In case of the second substrate 300 on which the second pads 302 spaced the second distance $x_2$ from each other are formed, the vertical distance $h_2$ between the bottom end of the solder ball SDB, in a state of being adsorbed on the holding holes 122, and the top surface of the second pad 302 may be determined by using the second distance $x_2$ between the two second pads 302 adjacent to each other and the inclination θ of the third eject pin 110a of the solder ball adsorbing apparatus. This will be described with reference to the following Equation (2).

$$h_2 = x_2 \times \tan\theta \quad (2),$$

where $h_2$ may be greater than $h_1$.

As described above, when the solder balls SDB are loaded on the substrates 200 and 300 on which the pads 202 and 302 spaced different distances from each other are formed, one solder ball adsorption apparatus may be used. Therefore, equipment manufactured according to the substrates 200 and 300 may be reduced in cost.

Figure 2D:
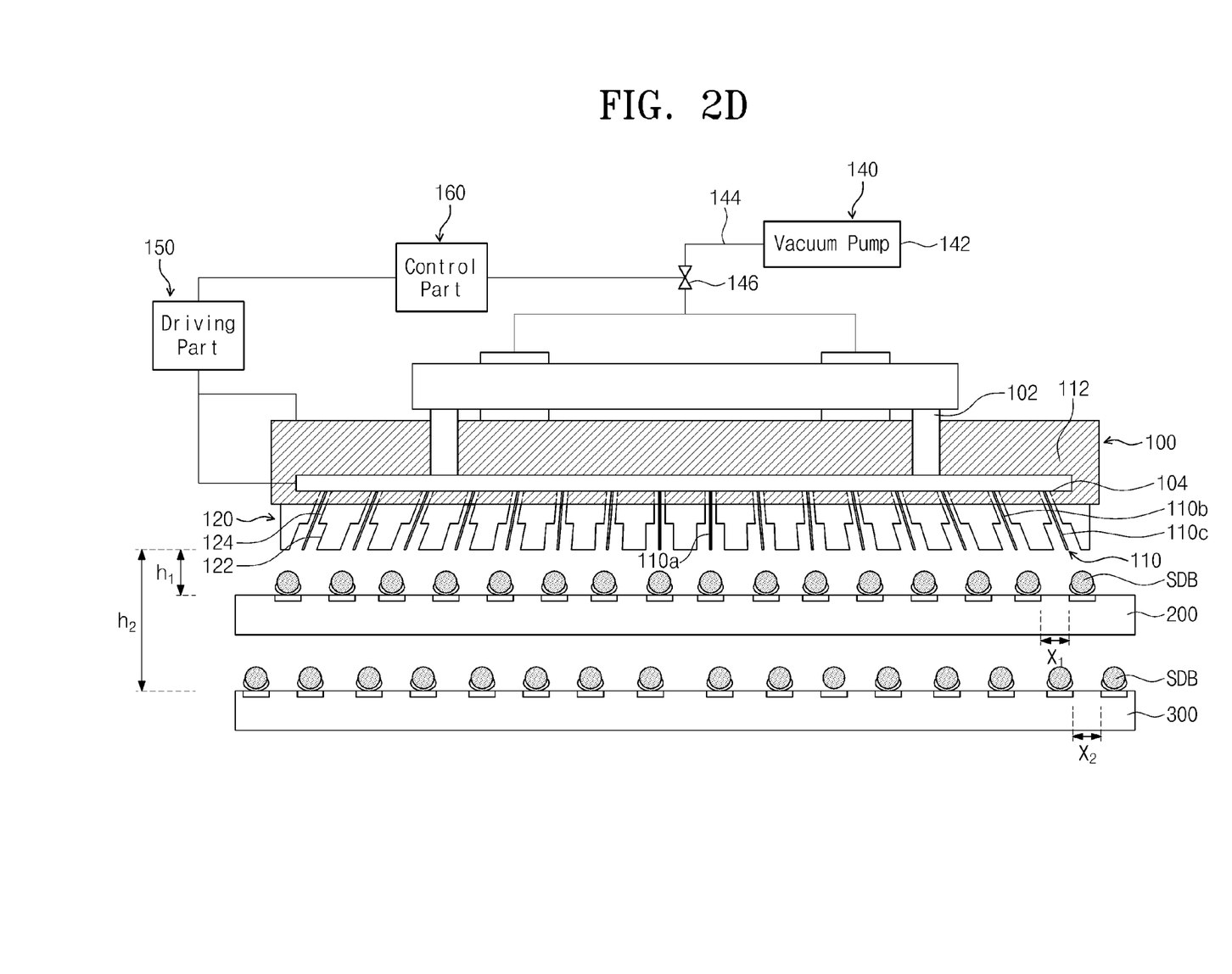

Referring to FIG. 2D, the solder balls SDB may be released from the solder ball adsorbing apparatus onto the pads 202 and 302 by using the eject pins 110. To release the solder balls SDB, the controller 160 may close the vacuum valve 146 to respectively move the eject pins 110 to the holding holes, in which the solder balls SDB are accommodated, by using the driver 150. Detailed descriptions on loading the solder balls SDB onto the pads 202 and 302 are omitted as they are well known in the art.

Although not shown in detail, a reflow process may be performed on the substrates 200 and 300 on which the solder balls SDB are loaded to allow the flux FLX to adhere to the solder balls SDB.

In the above embodiment described in reference to FIGS. 1A, 2C and 2D, the bottom end of the solder ball SDB in a state of being adsorbed on the holding holes 122 is disposed at an height which is the same or substantially the same as an height of a bottom end or edge of the holding hole 122 of the solder boll holder 120 with respect to the substrates 200 and 300. Thus, the respective vertical distances h1 and h2 between the bottom end of the solder ball SDB, in a state of being adsorbed on the holding holes 122, and the top surfaces of the first pad 202 and the second pad 302 are indicated as the same or substantially the same as respective distances between the bottom end or edge of the holding hole 122 of the solder boll holder 120 and the top surfaces of the first pad 202 and the second pad 302. However, according to another exemplary embodiment, the respective vertical distances h1 and h2 may be different from the respective distances between the bottom end or edge of the holding hole 122 of the solder boll holder 120 and the top surfaces of the first pad 202 and the second pad 302. Thus, in above Equations (1) and (2), h1 and h2 may be the respective vertical distances between the bottom end of the solder ball SDB, in a state of being adsorbed on the holding holes 122, and the top surfaces of the first pad 202 and the second pad 302, as described above, or the respective distances between the bottom end or edge of the holding hole 122 of the solder boll holder 120 and the top surfaces of the first pad 202 and the second pad 302, depending on a design of the solder ball adsorbing apparatus.

According to the above embodiments, since each of the eject pins 110a, 110b, 110c disposed on the edge of the solder ball SDB adsorbing apparatus is inclined at predetermined angle θs, when the substrates 200 and 300 is expanded to increase the distance between the pads 202 during the process, the distances between the solder ball adsorbing apparatus and the substrates 200 and 300 may be adjusted to align the solder balls SDB on the pads 202 and 203. Therefore, the misalignment between pads 202 and 203 and the solder balls SDB may be prevented to enhance the electrical reliability in the semiconductor package.

The description of the above embodiments is intended to be illustrative, and those with ordinary skill in the technical field will be understood that the inventive concept can be carried out in other specific forms without changing the technical idea or essential features. Therefore, the embodiments described above are only exemplary in all respects and not restrictive, and the inventive concept is defined by the following claims.

What is claimed is:

1. An apparatus for adsorbing solder balls, comprising:
   a body;
   a plurality of eject pins disposed in the body and configured to move in downward and upward directions with respect to a substrate on which the solder balls are to be loaded; and
   a solder ball holder disposed in the body and configured to hold the solder balls at the eject pins and release the solder balls therefrom,
   wherein the eject pins comprise:
   a first eject pin disposed at a center of the body in parallel with a vertical surface that is perpendicular to a bottom surface of the body; and
   a second eject pin disposed at an edge of the body at a first angle with respect to the vertical surface.

2. The apparatus of claim 1, wherein the eject pins further comprise the third eject pin disposed between the first and second eject pins at a second angle with respect to the vertical surface.

3. The apparatus of claim 2, wherein the second angle is substantially the same as the first angle.

4. The apparatus of claim 2, wherein the second angle is less than the first angle.

5. The apparatus of claim 1, wherein the eject pins are configured to move through a plurality of holes, respectively, disposed at the solder ball holder, and
   wherein each of the holes has a structure corresponding to a structure of each of the eject pins.

6. The apparatus of claim 1, further comprising a vacuum supplier connected to the solder ball holder to provide vacuum for respectively holding the solder balls on the eject pins.

7. The apparatus of claim 1, further comprising:
   a plate to which the eject pins are connected; and
   an eject pin driver connected to the plate configured to move the eject pins in the downward and upward directions.

8. The apparatus of claim 1, wherein the eject pins are disposed in the body symmetrically with respect to the first eject pin.

9. The apparatus of claim 1, further comprising a driver configured to move the solder ball holder in a downward direction toward the substrate to release the solder balls from the eject pins to be loaded on a plurality of pads formed on the substrate, respectively,
   wherein, at a time of releasing the solder balls from the eject pins, the driver is configured to maintain a vertical distance between a bottom end of the solder ball holder and each of the plurality of pads by using a distance x between two adjacent pads among the plurality of pads and an inclination θ of the second eject pin.

10. The apparatus of claim 1, wherein the body further comprises paths through which the plurality of eject pins respectively move.

11. The apparatus of claim 10, wherein the solder ball holder further comprises a plurality of holes in which the eject pins are configured to hold and release the solder balls, respectively, and
wherein each of the holes comprises:
a connection hole communicating with each of the paths; and
a holding hole communicating with the connection hole to hold and release each of the solder balls.

12. An apparatus for adsorbing solder balls, comprising:
a solder ball holder comprising a plurality of holes in which a plurality of eject pins are disposed therein to hold and release the solder balls therefrom, respectively,
wherein the plurality of holes comprise:
a first hole disposed at a center of the solder ball holder and extended to be parallel with a vertical surface that is perpendicular to a substrate on which the solder balls released from the eject pins are to be loaded; and
a second hole disposed at an edge of the solder ball holder and extended at a first angle with respect to the vertical surface.

13. The apparatus of claim 12, wherein the plurality of holes further comprise a third hole disposed between the first and second holes and extended at a second angle with respect to the vertical surface.

14. The apparatus of claim 13, wherein the second angle is substantially the same as the first angle.

15. The apparatus of claim 13, wherein the second angle is less than the first angle.

16. The apparatus of claim 12, further comprising a vacuum supplier connected to the solder ball holder to provide vacuum for respectively holding the solder balls on the eject pins.

17. The apparatus of claim 12, further comprising a driver configured to move the solder ball holder in a downward direction toward the substrate to release the solder balls from the eject pins to be loaded on a plurality of pads formed on the substrate, respectively,
wherein, at a time of releasing the solder balls from the eject pins, the driver is configured to maintain a vertical distance between a bottom end of the solder ball holder and each of the plurality of pads by using a distance x between two adjacent pads among the plurality of pads and an inclination $\theta$ of the second eject pin.

* * * * *